(12) United States Patent
Shinn et al.

(10) Patent No.: US 8,766,962 B2
(45) Date of Patent: Jul. 1, 2014

(54) BISTABLE DISPLAY DEVICE

(75) Inventors: Ted-Hong Shinn, Hsinchu (TW); Chi-Ming Wu, Hsinchu (TW); Yuan-Chih Tsai, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 723 days.

(21) Appl. No.: 12/370,796

(22) Filed: Feb. 13, 2009

(65) Prior Publication Data

US 2010/0053139 A1 Mar. 4, 2010

(30) Foreign Application Priority Data

Sep. 2, 2008 (TW) .............................. 97133596 A

(51) Int. Cl.
*G06F 3/038* (2013.01)
(52) U.S. Cl.
USPC ........................................................ 345/211
(58) Field of Classification Search
None
See application file for complete search history.

(56) References Cited

U.S. PATENT DOCUMENTS

| | | | | |
|---|---|---|---|---|
| 5,345,364 A * | 9/1994 | Biernath | ........................ | 361/749 |
| 6,154,190 A * | 11/2000 | Yang et al. | ....................... | 345/94 |
| 6,847,083 B2 * | 1/2005 | Murai | ........................... | 257/360 |
| 7,034,783 B2 * | 4/2006 | Gates et al. | ...................... | 345/84 |
| 7,545,358 B2 * | 6/2009 | Gates et al. | .................... | 345/107 |
| 2003/0156090 A1 * | 8/2003 | Munn et al. | ...................... | 345/97 |
| 2007/0195031 A1 * | 8/2007 | Miller et al. | ..................... | 345/87 |
| 2007/0220792 A1 * | 9/2007 | Capurso et al. | ................. | 40/463 |
| 2008/0225008 A1 * | 9/2008 | Madonna et al. | ............. | 345/173 |
| 2008/0238813 A1 * | 10/2008 | Gettemy et al. | ............... | 345/1.3 |
| 2009/0267934 A1 * | 10/2009 | Chui et al. | ..................... | 345/212 |
| 2010/0259524 A1 * | 10/2010 | Markvoort et al. | ........... | 345/211 |

FOREIGN PATENT DOCUMENTS

| | | |
|---|---|---|
| CN | 1604297 A | 4/2005 |
| CN | 1928975 A | 3/2007 |
| CN | 2938402 Y | 8/2007 |
| CN | 101673052 B | 7/2012 |
| JP | 63252270 A | 10/1988 |
| JP | 5291368 A | 11/1993 |
| JP | 2007087999 | 4/2007 |
| TW | I286374 | 9/2007 |

OTHER PUBLICATIONS

Office Action From China Patent Office.
Serach Report—Office Action.

\* cited by examiner

*Primary Examiner* — Joseph Haley
*Assistant Examiner* — Emily Frank
(74) *Attorney, Agent, or Firm* — Chun-Ming Shih

(57) ABSTRACT

In a bistable display device having a driver circuit, the driver circuit has multiple electrical ports for electrically connecting to external circuits. The electric potential difference between any two neighboring ports is less than 10 volts so that electrical punch-through caused by great electric potential difference and short distance between the electrical ports is substantially avoided.

6 Claims, 2 Drawing Sheets

BISTABLE DISPLAY DEVICE

BACKGROUND

1. Field of the Invention

The present invention relates to a bistable display device, and more specifically, to a configuration of electrical ports of a bistable display device.

2. Description of Related Art

The outdoor reflective display has been widely used today. Most of such displays are used in portable devices. As a result, there has been a great demand for displays that are lightweight and small-sized and thus it is becoming more and more important to design display devices that are relatively light in weight and thin in thickness.

Traditional Liquid Crystal Displays (LCDs) such as TFT (Thin Film Transistor) LCDs have been maturely developed and shrinking of the thickness of LCDs has approached to a limit. In other words, now it is rather difficult to further shrink the thickness of the LCDs. To meet the demand for products such as electronic books and electronic paper, many companies are looking at the research and development of bistable displays, which have a great potential to be one of the mainstream types of displays in the future.

Currently the bistable display device usually has a driver IC (Integrated Circuit) that is electrically connected to external circuits. The driver IC includes a source IC and a gate IC. The bistable display device further includes a flexible printed circuit (FPC). According to different module processes or designs, bistable display devices can be divided into different types such as chip on glass (COG), tape automatic bonding (TAB), chip on film (COF) and so on. With all such different designs, there will be different positional displacement between the ICs, the electronic components and the display device. During plugging and unplugging of all kinds, damages may be made to the FPC and the substrate caused by the pulling tearing, and alignment stress. Such damage may be mechanical and/or electrical and may impair the optimal operation or the stability of the bistable display device. Especially in terms of electrical effects, the electric voltage used in bistable display device is normally higher than the voltage used in TFT LCDs (typically 3~5 volts, 6~8 volts maximum). If neighboring ports of the ICs in the bistable display device are separated by the same distance as in the case of a TFT LCD, when the electric potential difference between the ports is relatively large, for example, greater than or equal to 10 volts, the electrostatic interference between the ports may be quite significant, which may cause the driver IC of the bistable display device to function unstably and the image quality to be compromised. In a worse case, the material between the neighboring ports may be electrically punched through, which may in turn cause short circuits and the whole IC to be burned and damaged. This problem thus has become an important one in design of bistable display devices.

BRIEF SUMMARY

The present invention is to provide a bistable display device wherein electrical punch-through caused by great electric potential difference and short distance between the electrical ports of the circuits is substantially avoided.

A bistable display device according to a preferred embodiment of the present invention is provided. The bistable display device includes a driver circuit. The driver circuit has a plurality of ports for electrical connection. The electric potential difference between any two neighboring ports is less than 10 volts.

In the preferred embodiment, at least a port between any two ports is set to be floating, or alternatively, at least a port between any two ports is set to have a predetermined voltage level so that the electric potential difference between any two neighboring ports is less than 10 volts.

By keeping the electric potential difference between any two neighboring ports less than 10 volts, the problem of electrical punch-through caused by great electrical difference and short distance between the ports has been improved. The production yield can be improved and a certain level of electrostatic protection of the final products can be achieved. The problems in quality or reliability of the bistable display device caused by improper plugging or unplugging are alleviated so that the bistable display device including the driver IC and the FPC are protected from electrostatic punch-through.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
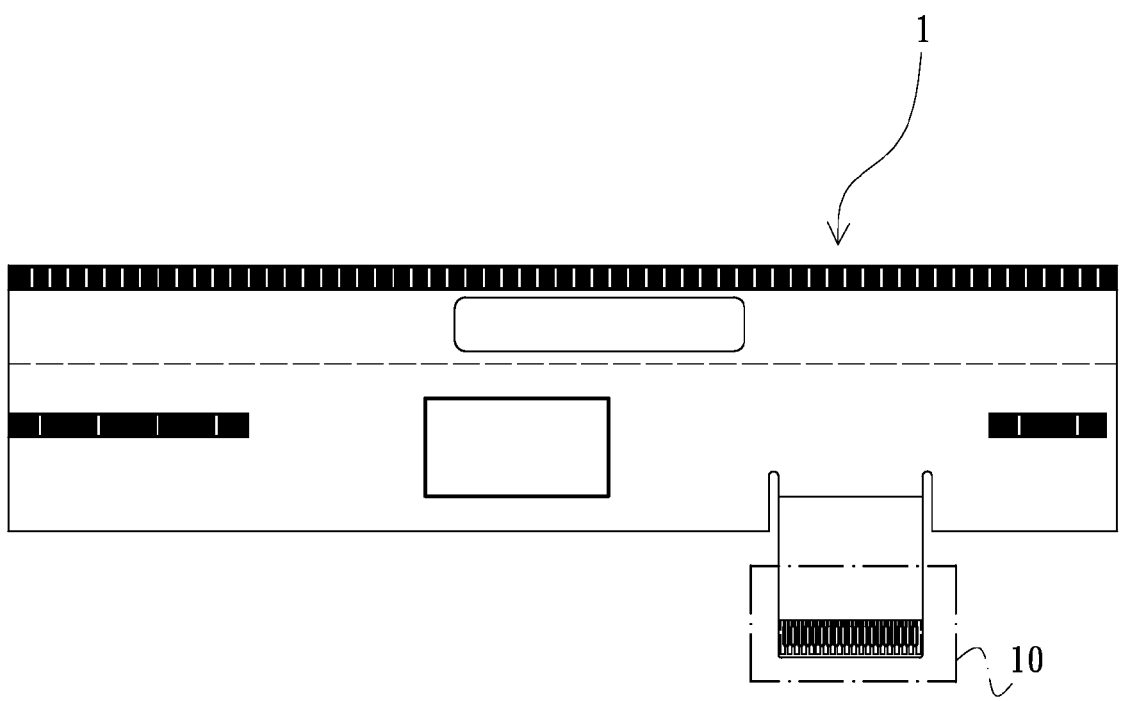
FIG. 1 a schematic view of a driver circuit of a bistable display device according to a preferred embodiment of the present invention.

Referring to FIG. 1, a driver circuit 1 of a bistable display device according to a preferred embodiment of the present invention is provided. The driver circuit 1 is intended to drive the bistable display device to display video. The driver circuit 1 has a connection portion 10 for connecting to and communicating with external circuits.

It is to be understood that the driver circuit 1 can be applied to various kinds of bistable display devices, such as electrophoretic displays and cholesteric liquid crystal displays. An example of electrophoretic displays is E-ink displays.

Figure 2:
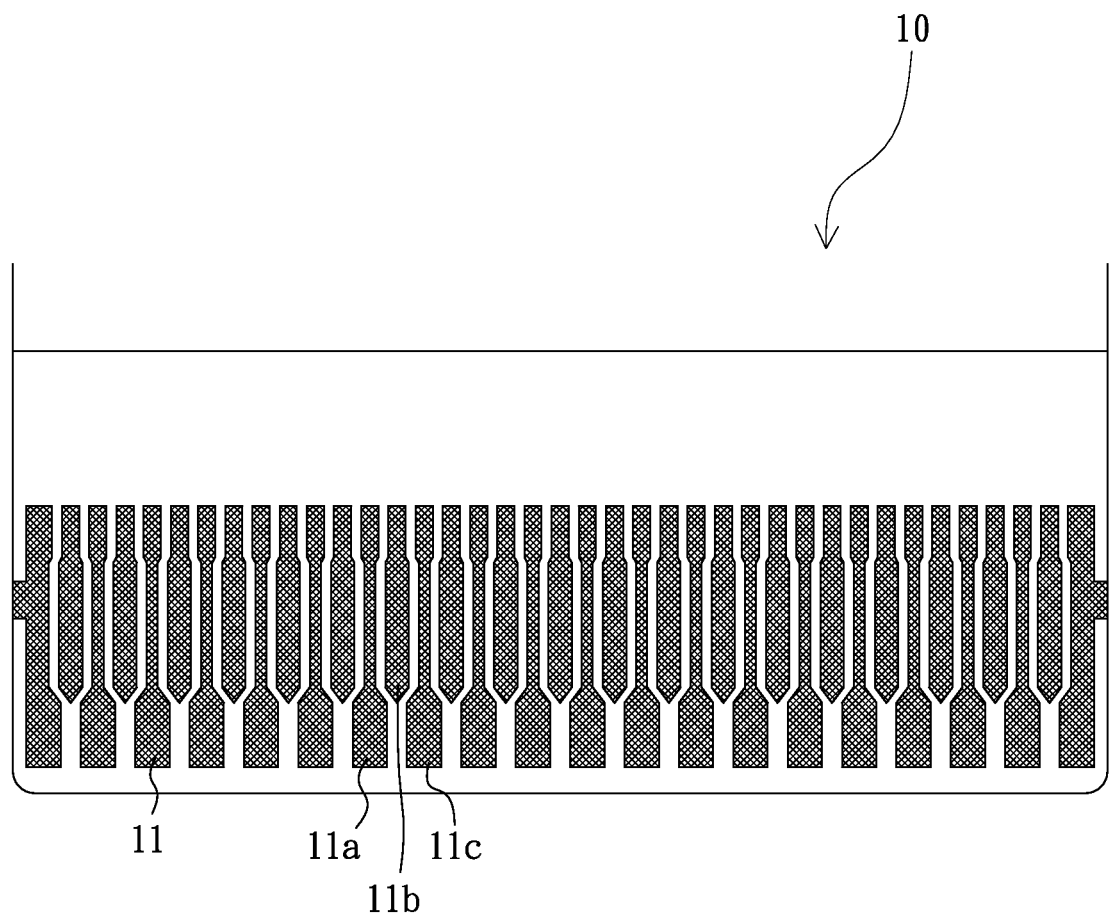
FIG. 2 is a magnified view of a connection portion of the driver circuit depicted in FIG. 1.

Referring to FIG. 2, a plurality of ports 11 are disposed on the connection portion 10. The connection portion 10 is electrically connected to external circuits through the ports 11. In normal operations, the voltages on the ports 11 range from 10 volts to 40 volts. In this embodiment, the electric potential difference between any two neighboring ports is less than 10 volts.

More specifically, in this embodiment, the plurality of ports 11 includes a first port 11a, a second port 11b and a third port 11c. The second port 11b is between the first port 11a and the third port 11c and set to be floating. In other words, the second port 11b is not connected to any external circuits. Such design can prevent electrostatic punch-through caused by great electric potential difference and short distance between the first port 11a and the third port 11c from happening.

It is to be understood that multiple second ports 11b, all of which are set to be floating, can be disposed between the first port 11a and the third port 11c to achieve the above-mentioned effect.

In another preferred embodiment of the present invention, also referring to FIG. 2, the electric potential difference between the first port 11a and the third port 11c is 15 volts. The second port 11b between the first port 11a and the third port 11c is set to have a predetermined potential (not shown in FIG. 2) so as to ensure the electric potential difference between any two neighboring ports is less than 10 volts, which means the electric potential difference between the first port 11a and its neighboring the second port 11b and the electric potential difference between the second port 11b and its neighboring the third port 11c are all less than 10 volts. This way, electrostatic punch-through caused by great electric potential difference and short distance between neighboring ports can be prevented from happening.

In the above embodiments, by keeping the electric potential difference between any two neighboring ports less than 10 volts, the problem of electrical punch-through caused by great electrical difference and short distance between the ports has been improved. The production yield can be improved and a certain level of electrostatic protection of the final products can be achieved. The problems in quality or reliability of the bistable display device caused by improper plugging or unplugging are alleviated so that the bistable display device including the driver IC and the FPC are protected from electrostatic punch-through.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A bistable display device comprising a driver circuit, the driver circuit having a plurality of electrical ports for connecting to external circuits, wherein the plurality of electrical ports comprise multiple first-type ports and multiple second-type ports alternately arranged along a specified direction, at least one second-type port is located between any two adjacent first-type ports, and the second-type ports are set to be floating, which are not connected to the external circuits, or each second-type port has a predetermined potential to achieve that an electric potential difference between any two adjacent ports is less than 10 volts.

2. The bistable display device of claim 1, wherein the bistable display device is a cholesteric liquid crystal display.

3. The bistable display device of claim 1, wherein the bistable display device is an electrophoretic display.

4. A bistable display device comprising a driver circuit, the driver circuit being for driving the bistable display device to display video and comprising a connection portion for connecting to an external circuit, wherein the connection portion comprises a plurality of first-type electrical ports and a plurality of second-type electrical ports, the first-type electrical ports and the second-type electrical ports alternately are arranged along a specified direction on the connection portion, at least one second-type port is located between any two adjacent first-type ports, and the first-type electrical ports rather than the second-type electrical ports are electrically connected with the external circuit, wherein each of the second-type ports has a predetermined potential to achieve that an electric potential difference between any two adjacent ports is less than 10 volts.

5. The bistable display device of claim 4, wherein the bistable display device is a cholesteric liquid crystal display.

6. The bistable display device of claim 4, wherein the bistable display device is an electrophoretic display.

* * * * *